(12) United States Patent
Brambilla et al.

(10) Patent No.: US 7,348,682 B2
(45) Date of Patent: Mar. 25, 2008

(54) METHOD AND STRUCTURES FOR INDEXING DICE

(75) Inventors: Daniele Alfredo Brambilla, Sovico (IT); Marco Natale Valtolina, Agrate Brianza (IT)

(73) Assignee: STMicroelectronics S.r.l. (IT)

( * ) Notice: Subject to any disclaimer, the term of this patent is extended or adjusted under 35 U.S.C. 154(b) by 34 days.

(21) Appl. No.: 11/109,977

(22) Filed: Apr. 19, 2005

(65) Prior Publication Data

US 2005/0275068 A1 Dec. 15, 2005

(30) Foreign Application Priority Data

Apr. 19, 2004 (EP) .................................. 04101599

(51) Int. Cl.
*H01L 23/544* (2006.01)
(52) U.S. Cl. ...................................... 257/797; 257/758
(58) Field of Classification Search ................ 257/797, 257/758; 438/401
See application file for complete search history.

(56) References Cited

U.S. PATENT DOCUMENTS

| | | | |
|---|---|---|---|
| 4,409,686 A | 10/1983 | Harlow et al. | |
| 5,294,812 A | 3/1994 | Asoh et al. | |
| 5,760,421 A * | 6/1998 | Takahashi et al. | ............. 257/59 |
| 6,638,831 B1 * | 10/2003 | Roberts et al. | ............. 438/401 |
| 6,888,260 B2 * | 5/2005 | Carpi et al. | ................. 257/797 |

FOREIGN PATENT DOCUMENTS

| | | |
|---|---|---|
| CA | 2 320 612 A | 3/2002 |
| EP | 0 434 141 A | 6/1991 |
| WO | WO 01/39269 A | 5/2001 |

OTHER PUBLICATIONS

European Search Report for EP 04 10 1599 dated Sep. 7, 2004.

* cited by examiner

*Primary Examiner*—Roy Karl Potter
(74) *Attorney, Agent, or Firm*—Lisa K. Jorgenson; Bryan Santarelli; Graybeal Jackson Haley LLP

(57) ABSTRACT

A method of indexing a plurality of dice obtained from a material wafer comprising a plurality of stacked material layers, each die being obtained in a respective die position in the wafer, the method including providing a visible index on each die indicative of the respective die position, wherein providing the visible index on each die includes: forming in a first material layer of the die a reference structure adapted to defining a mapping of the wafer; and forming in a second material layer of the die a marker associated with the reference structure, a position of the marker with respect to the reference structure being adapted to provide an indication of the die position in the wafer.

13 Claims, 7 Drawing Sheets

METHOD AND STRUCTURES FOR INDEXING DICE

PRIORITY CLAIM

This application claims priority from European patent application No. EP04101599.1, filed Apr. 19, 2004, which is incorporated herein by reference.

TECHNICAL FIELD

The present invention relates in general to devices integrated in semiconductor chips, particularly to the fabrication thereof. More specifically, the present invention relates to a method of indexing dice, including integrated devices, obtained from a semiconductor material wafer.

BACKGROUND

Electronic circuits, as well as e.g. micro-mechanical and/or optical structures and opto-electronic devices, can be integrated in a chip obtained from a semiconductor material wafer by means of a process typically executed in a sequence of stages. At the end of such a process the wafer includes a plurality of chips, or dice, which are then separated by sawing; typically, the chips are then embedded in packages suitable for their use.

In the case in which the chips are found to be defective or subject to failures during operation and are returned to the manufacturer for analysis of the failure, the possibility of recovering the original position of the chips in the wafer before sawing is of strategic importance for quality management of the manufacturing process. In fact, functional (e.g. electrical or optical) parameters, performance and reliability of each chip can vary with the position in the wafer, for example because the crystallographic quality of the wafer material can vary with the position in the wafer. Accordingly, analysis on failure occurrences is very useful for allowing the manufacturers to devise strategies for improving the chip quality.

For this purpose, an indication of such a position is provided on each chip, i.e., a so-called die (or chip) indexing is exploited for recovering the die position in the wafer.

In the art, die indexing methods are known in which a visible sign is provided on each chip during the fabrication process, e.g. on an upper passivation layer in the stack of material layers of the wafer, in such a way that it is possible to read a die index by non-invasive inspection also when the chip has failed. For example, the index can be a respective number of a number sequence, assigned to each chip of a wafer, provided on a boundary portion of the chip.

A process of fabricating chips from a wafer is executed in different stages in which a plurality of masks is usually exploited for defining desired patterns in layers of the wafer. Roughly speaking, a mask is a flat plate containing photographic images (i.e., transparent and opaque areas) of structures useful to implement, for example, the integrated circuits of the chips on wafer material layers.

At prescribed stages, the wafer is coated with a layer of a photosensitive material, typically referred to as photosensitive resist or photoresist, and a mask, properly aligned with the wafer, is illuminated by an optical system with light in a range of wavelengths suitable for exposing the photoresist. Thus, the images on the mask are projected and transferred onto the photoresist layer coating the wafer. The exposed photoresist is then developed to produce a pattern on the wafer which identifies areas of material layers to be etched (one such sequence of the fabrication process is termed photolithography).

The fabrication process can be performed by means of traditional projection equipment, comprising the optical system, in which the wafer is positioned and aligned with the masks necessary for the fabrication process. As long as the wafer dimension is relatively small, such masks include a number of images equal to the number of chips to be obtained from the wafer and the whole wafer is exposed through that mask in one go.

Typically, methods of indexing exploiting the projection equipment require that one of the plurality of masks includes the images of the indexes of all the chips formed on the wafer.

The increase in wafer size has led to the introduction of projection equipment employing so-called wafer steppers, in which the images of the mask useful to manufacture the chips are projected onto portions of the wafer "step by step", instead of in a single go. A wafer stepper includes the optical system and an appropriate alignment system for aligning the optical system, the mask and the wafer in a "step by step" fashion. In the case in which the wafer stepper is used, the projected image of the mask typically covers an area which is a portion of the total wafer area. After each exposure, the wafer in the wafer stepper is moved under the optical system by exactly the size of the projection of the mask on a plane of the wafer. The wafer steppers make it possible to obtain a plurality of chips from wafers larger than (typically, of eight inches) the wafers traditionally used with a conventional projection equipment (of maximum six inches). Regretfully, this makes the traditional masks exploited with a projection equipment not compatible to the substantially larger wafers manufactured by means of a wafer stepper and, accordingly, using the wafer steppers it is not possible to project the images of the indexes of all the chips formed on the wafer in one go.

Alternative methods of die indexing exploit non-volatile storage elements, integrated in the chips, such as EPROM devices, for storing information relating to die coordinates indicative of the die positions in the wafer, written therein during testing, for example. However, such methods increase costs of the fabrication process, by adding service storage elements in the chips, and thus semiconductor area (non-volatile storage elements occupy portions of an intended active area of the chip in which, for example, the integrated circuits have to be implemented) and, possibly, dedicated process stages. In addition, such methods make the chips even more prone to defects, and in case the failed chips undergo functional failures, the stored information on the die coordinates may be not recoverable.

SUMMARY

In view of the state of the art outlined in the foregoing, an embodiment of the present invention overcomes one or more of the above-mentioned drawbacks, in particular, providing a method of indexing dice obtained from a semiconductor material wafer.

More specifically, these drawbacks can be overcome by devising a method of die indexing compatible with the use of wafer steppers, allowing a visible index without adding costs to the fabrication process and without wasting active area of the chips.

Summarizing, an embodiment of the invention is a method for indexing a plurality of dice obtained from a material wafer comprising a plurality of stacked material layers, each die being obtained in a respective die position in the wafer, including providing a visible index on each die indicative of the respective die position, wherein providing the visible index on each die includes: forming in a first material layer of the die a reference structure adapted to defining a mapping of the wafer; and forming in a second material layer of the die a marker associated with the reference structure, a position of the marker with respect to the reference structure being adapted to provide an indication of the die position in the wafer.

For the index to be visible there is intended visible (directly or indirectly) to the human eye or to a suitable image recognition equipment, this embodiment exploits an electromagnetic radiation or a particle beam at a suitable wavelength, such as light, infrared radiation, ultraviolet radiation, even X-rays, or even electron beams.

BRIEF DESCRIPTION OF THE DRAWINGS

Features and the advantages of the present invention will be made clear by the following description of an embodiment thereof, provided purely by way of non-limitative description that will be conducted making reference to the attached drawings, wherein.

DETAILED DESCRIPTION

Figure 1A:
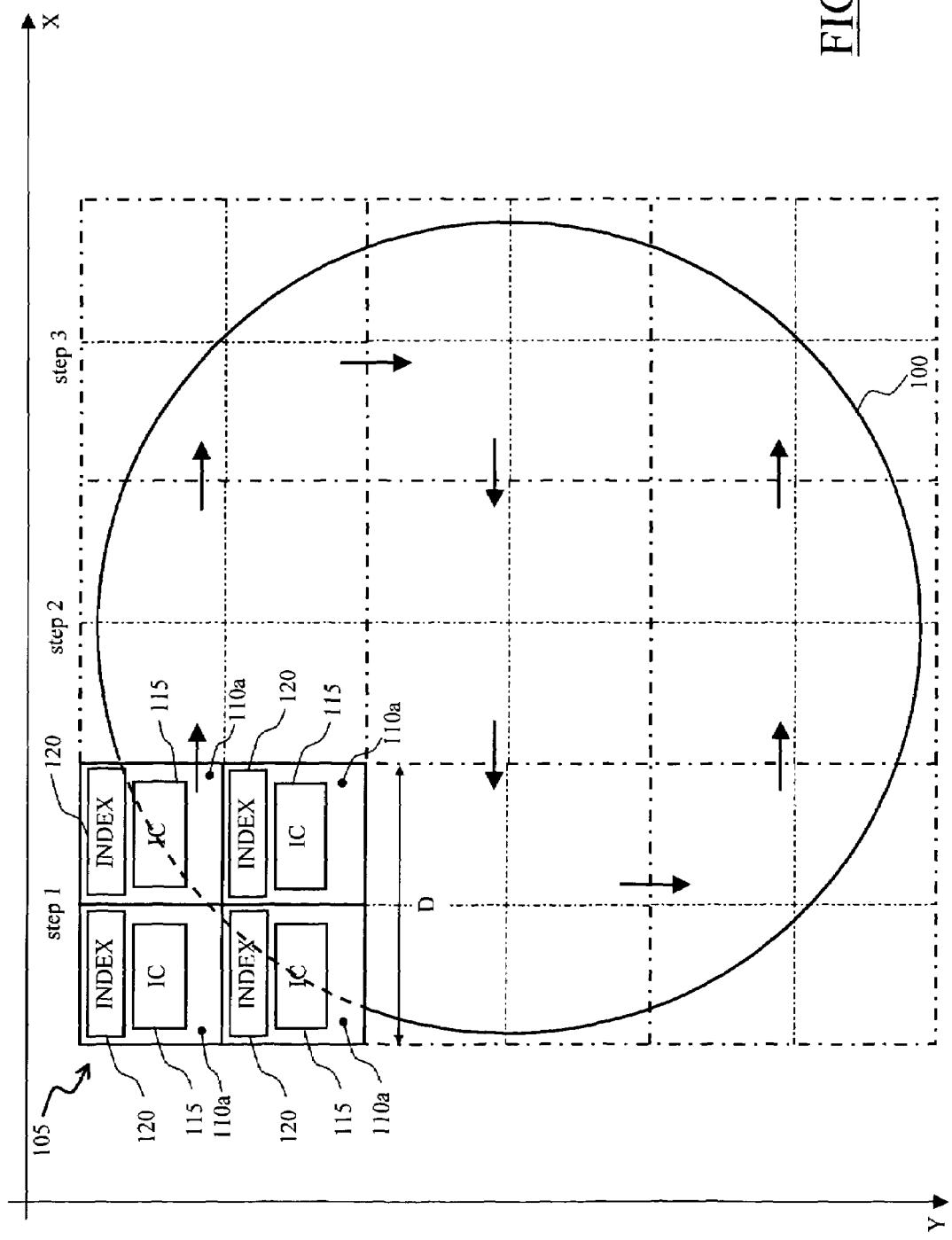
FIG. 1A illustrates a semiconductor material wafer, exposed to radiation through a generic mask in a sequence of steps, from which a plurality of chips are manufactured by a fabrication process in which a first embodiment of the present invention is applicable.

Referring in particular to FIG. 1A, a semiconductor material wafer 100 aligned with a generic mask (also referred to as reticle) 105 is schematically illustrated, during a process for fabricating a plurality of chips from the wafer 100, in which a first embodiment of the present invention is applicable. The chips are represented by areas of the wafer 100 (typically having a circular shape) in which, for example, integrated circuits (ICs) are formed.

The fabrication process is performed in a plurality of stages, in which a plurality of photolithographic reticles 105 is exploited for patterning different stacked material layers of the wafer forming the ICs. A generic reticle 105 includes images 110a for manufacturing a prescribed number of chips (for example, four chips) on the wafer 100; in the considered example, the chips, and accordingly the reticle 105, have a square shape. The images 110a normally include structures 115 useful to implement the ICs of the chips in the wafer material layers (hereinafter referred to as IC structures 115).

At a stage of the fabrication process in which a photolithographic reticle 105 has to be exploited, the wafer 100 is coated with a photoresist and the reticle 105, aligned with the coated wafer, is illuminated with light in a suitable range of wavelengths in such a way that the photoresist is exposed by means of the projected images 110a.

Exploiting a per-se known wafer stepper, the same reticle 105 is illuminated, and the wafer shifted under the reticle 105 many times, i.e. the photoresist is completely exposed in a plurality of steps (for example, nine steps). In this way, considering the exemplary reticle 105 comprising four images 110a, thirty six images are projected in a two-dimensional arrangement in the corresponding stage of the fabrication process (as shown by the arrows in FIG. 1A). A ratio between the area of the images 110a in the reticle 105 and the area of the images projected on the wafer depends on the optical system of the wafer stepper; in the considered example such a ratio is 1:1.

Each step of the wafer 100 under the reticle 105 corresponds to a respective relative position of the reticle 105 over the wafer 100. The shift of the wafer 100 in the wafer stepper can be precisely controlled by means of a control software exploiting job control files for properly positioning the wafer 100 in a prescribed way.

Depending on the specific geometry of the wafer 100 and of the reticles 105, at a first step (step 1) the reticle 105 is projected only partially on the wafer 100 (as shown in the drawing). At a successive step (step 2, step 3) the wafer 100 is moved along an axis X by a prescribed distance D (equal to the size of the area of the reticle 105 projected on the wafer plane) for exposing portions of the wafer 100 adjacent to the portion exposed at the previous step 1, 2. At a step 4 the wafer 100 is moved along an axis Y, orthogonal to the axis X, by the prescribed distance D; at steps 5 and 6 the wafer 100 is moved again along the axes X, but in the opposite direction, and so on.

Figure 1B:
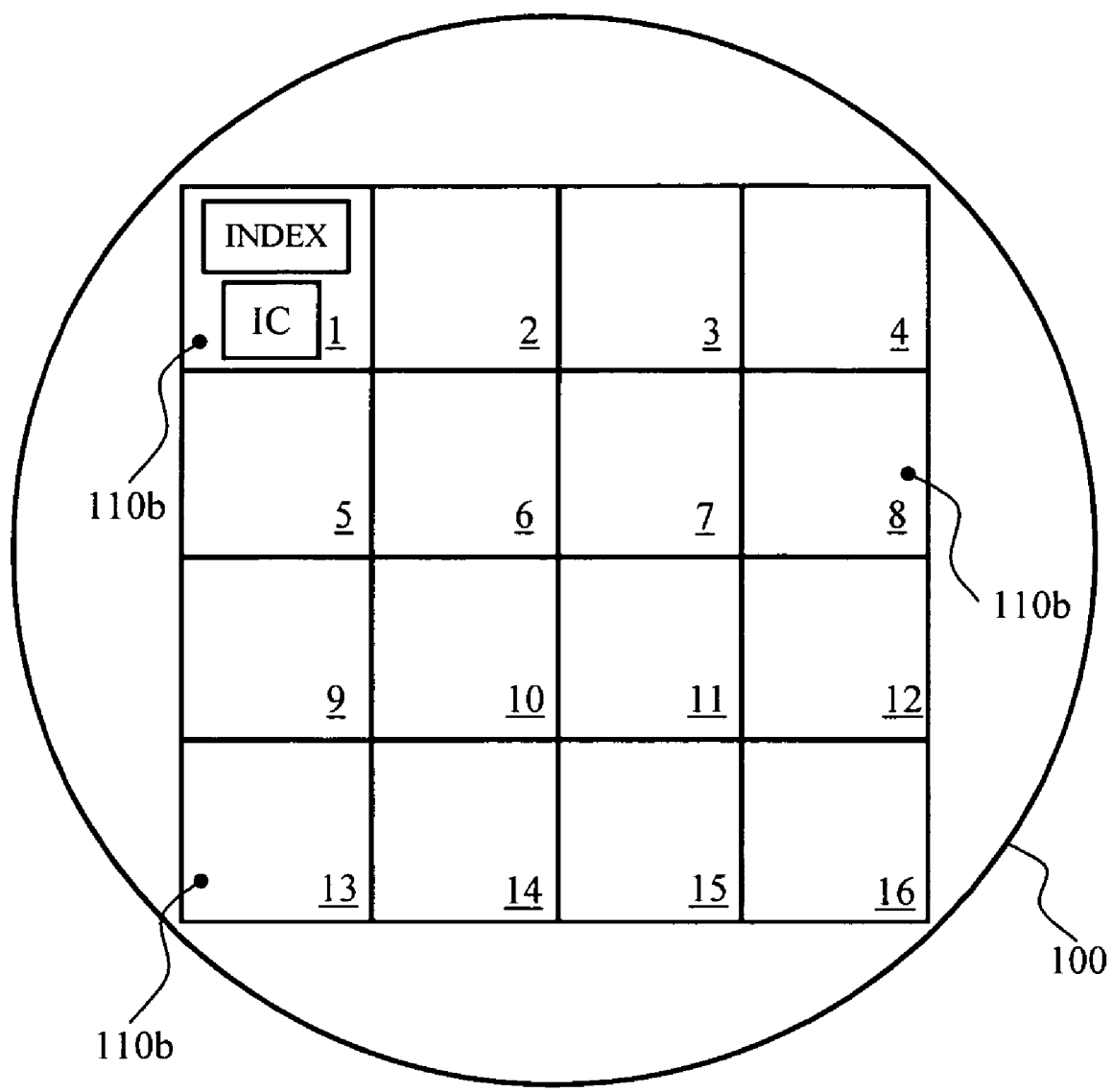
FIG. 1B is a schematic illustration of the wafer at the end of the fabrication process.

Considering FIG. 1B, the wafer 100 is schematically shown at the end of the fabrication process, when a two-dimensional arrangement of chips 110b has been obtained, after having exposed, in the above-described "step by step" fashion, all the portions of the area of the wafer 100 through the plurality of reticles exploited at different stages of the fabrication process.

Exposing in nine steps the wafer 100 through the plurality of reticles, each including four images, an arrangement of sixteen chips 110b is obtained from a wafer 100, for example, of eight inches and each chip 110b has a respective position on the wafer 100 identified in the drawing by numbers 1 to 16. Then, the chips (or dice) 110b are separated by cutting the wafer 100 preferably with a diamond saw; typically, the dice 110b are mounted in suitable packages for being shipped to customers, and used.

In order to retrieve the original position of the generic die 110b on the wafer 100 also after sawing, a respective visible index, indicative of such a position 1-16, is left on each chip 110b.

In this embodiment of the present invention, the visible index is an appropriate sign formed on the chip 110b at a chosen stage of the fabrication process, in which a material layer, sufficiently up in the stack of material layers forming the ICs so as to be visible by non-invasive inspection, has to be patterned (for example, a metal, polysilicon, oxide or passivation layer). In this way an index is visible, for example, by using of a low power microscope; alternatively, the index provided on the chips can be visible although not (or not directly) to the human eye, by means of devices exploiting radiation at suitable wavelengths (such as X-rays, for example).

Referring back to FIG. 1A, the visible index can be formed during a selected stage of the fabrication process by means of a generic reticle 105 of the plurality of reticles used during the manufacturing, in which the images 110a further include suitable structures 120 adapted to define indexing patterns on the wafer (hereinafter referred to as index structures 120).

It is pointed out that the real proportions of the IC structures 115 and of the index structures 120 on the reticles 105 are not respected in the drawings, for simplicity of illustration.

Figure 2A:
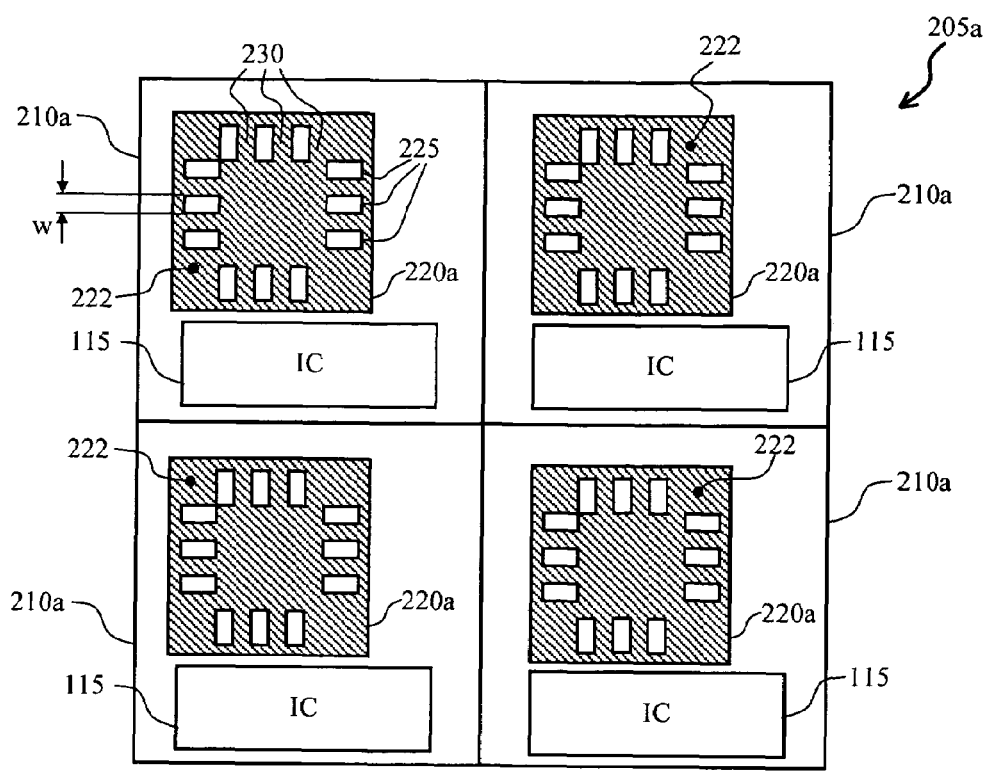
FIG. 2A shows a first mask exploited for implementing a chip indexing method according to the first embodiment of the present invention.

Considering now FIG. 2A, a reticle 205a according to the first embodiment of the present invention is illustrated. The reticle 205a is one of the plurality of reticles exploited during the fabrication process for forming the ICs of the chips, particularly for defining a desired pattern in the material layers forming the ICs.

The reticle 205a includes, for example, four identical images 210a comprising the IC structures 115, as in the schematic example of FIGS. 1A-1B; in addition to the IC structures 115, the images 210a further include respective index structures 220a, for marking the dice with a reference structure, as described in greater detail in the following. The reticle 205a including the index structures 220a is exploited at a selected stage of the fabrication process, in which a pattern is defined on an upper material layer (for example, a metal layer) of the dice; in this way, the reference structure, once formed, is visible, for example, by using a low power microscope.

As described with reference to FIG. 1A, at a stage of the fabrication process, the images 210a are projected at respective predetermined positions in a two-dimensional arrangement, for exposing step-by-step the whole wafer coated with the photoresist. Accordingly, the positions of the projected images 210a can be associated with elements of a N×M matrix (in the considered example, a 6×6 matrix), and then the die in the wafer can be associated with corresponding element of this N×M matrix. In this way, for example, the element (2,2) of such a matrix corresponds to the die in the position 1 in the wafer (as illustrated in FIG. 1B).

The four index structures 220a are identical to each other, and each one corresponds to such a 6×6 matrix. As described in greater detail in the following, the four identical index structures 220a are exploited as references in the indexes for a correct reading of the positions of the dice, and hereinafter are referred to as reference index structures 220a.

In detail, each reference index structure 220a includes, for example, a generally rectangular, e.g. square, area 222 opaque to light (represented in the drawing as a dashed area) and four sets of three, e.g. rectangular, marks 225 transparent to light are arranged within the opaque area 222, for identifying respective rows and columns of the 6×6 matrix. Particularly, the three marks 225 of each set are spaced apart from each other of a distance roughly equal to their width w. The four sets of the marks 225 are arranged along respective sides of the square area 222; each mark 225 of the respective set is aligned with one mark 225 of the set corresponding to the opposite side of the square area 222, thus defining a respective row or column of the 6×6 matrix within the square area 222.

The marks 225 are spaced apart from each other, and also opaque inter-mark spaces 230 between two adjacent parallel marks 225, having a width w, are exploited to identify a respective row or column. In fact, in the above-described arrangement of the marks 225, each space 230 on one side of the square area 222 is aligned with a corresponding space 230 on the opposite side, thus defining a row or a column of the matrix within the square area 222.

Accordingly, three transparent marks 225 and three opaque spaces 230 on two opposite sides of the square area 222 identify six rows or six columns within the index structure 220a. For example, two first aligned marks 225 identify a first row of the matrix, while respective first adjacent spaces 230 identify a second row; two second aligned marks 225, adjacent to the respective first spaces 230, identify a third row of the matrix, while respective second spaces 230, adjacent to the second marks 225, identify a fourth row and so on. Similar considerations apply for the columns, and a two-coordinates system is thus defined.

Figure 2B:
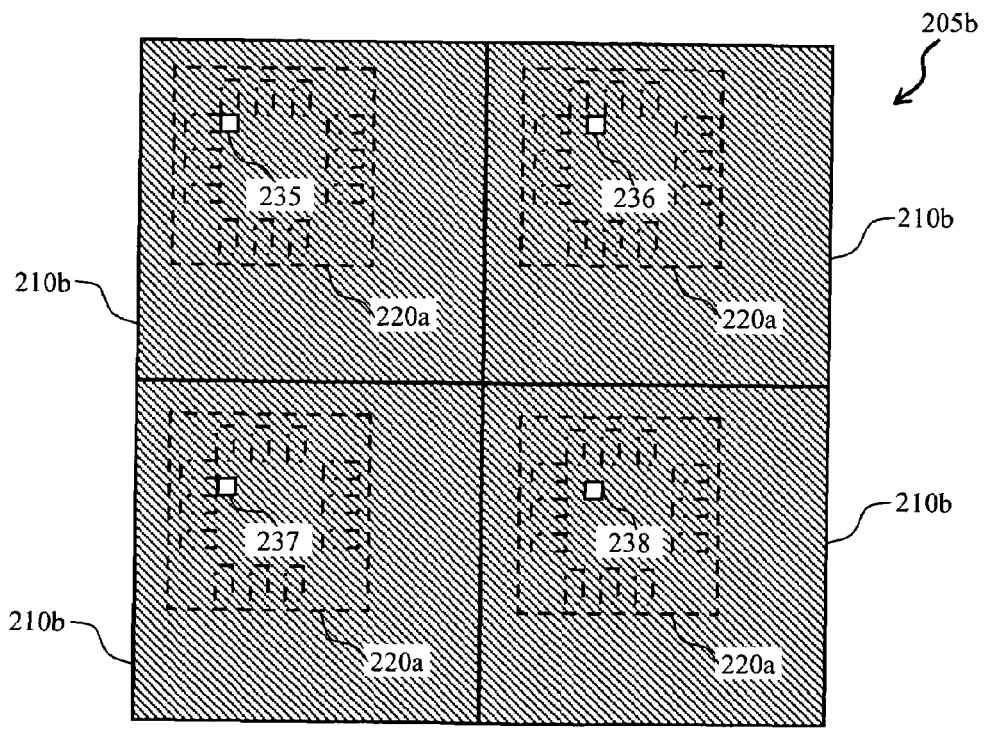
FIG. 2B schematically shows a second, service mask exploited for implementing the chip indexing method according to the first embodiment of the present invention.

With reference to FIG. 2B, an additional, service reticle 205b according to the first embodiment of the present invention is illustrated. The service reticle 205b includes, as the above-described reticle 205a, four images 210b.

The service reticle 205b is completely opaque to the light except for four transparent dots 235, 236, 237 and 238 included in the respective images 210b (the opaque area of the service reticle 205b is shown as dashed); in this way, the structures previously exposed in the photoresist are protected during a successive exposition.

In the reticle 205b the image 210b comprising the dot 235 is adjacent to the images 210b comprising the dots 236 and 237. In detail, if the service reticle 205b is ideally superimposed on the reticle 205a (the reference structure 220a of the reticle 205a is represented by dash-and-dot lines), the positions of the dots 235-238 are such that the dots 235 and 236, having a size roughly equal to the width w of the marks 225, are located in correspondence of the first row, first and second columns of the reference index structure 220a, respectively, whereas the dots 237 and 238 are located in correspondence of the second row, first and second columns of the reference index structure 220a, respectively.

Figure 3:
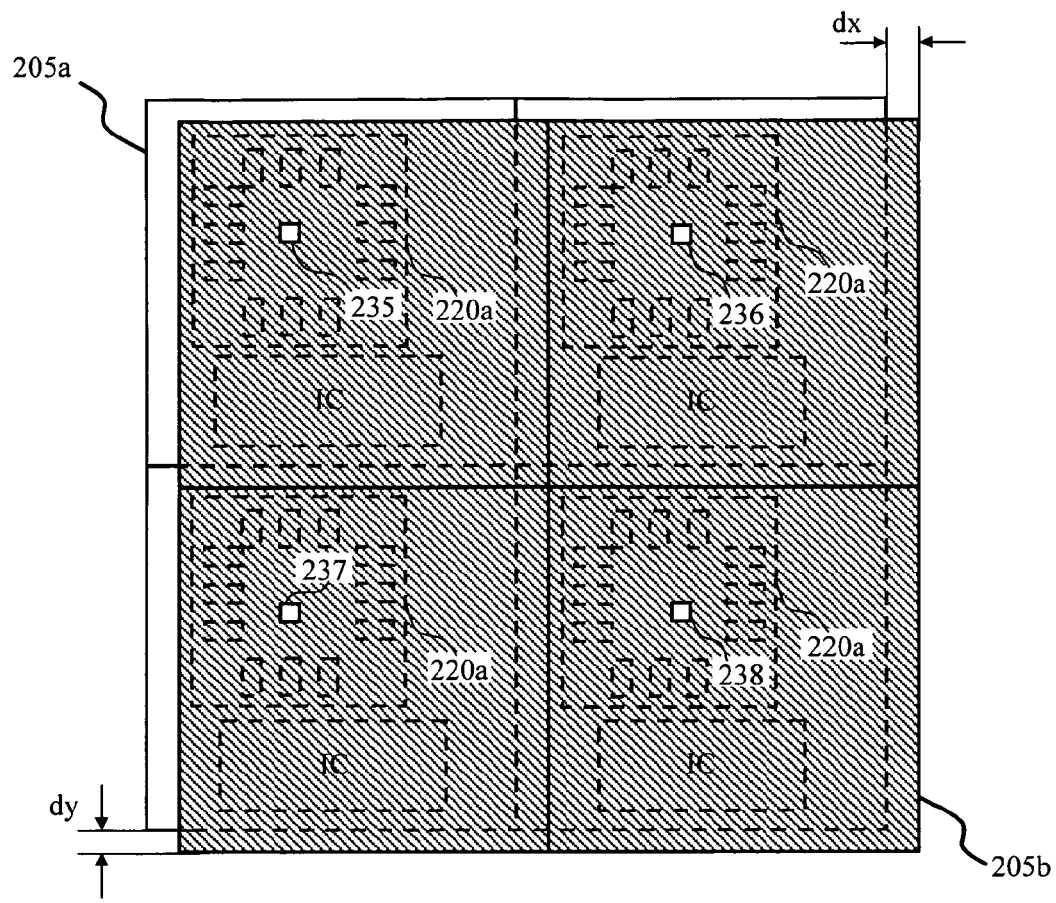
FIG. 3 ideally represents the service mask superimposed on the first mask at a step of the step sequence of the fabrication process.

Now, considering FIG. 3, let it be supposed that the additional service reticle 205b, shown again ideally superimposed on the reticle 205a, is shifted horizontally (i.e., parallelly to the rows of the reference index structure 220a) by a small horizontal offset dx, and, vertically (i.e., parallelly to the columns of the reference index structure 220a), by a small vertical offset dy.

If the horizontal and vertical offsets dx and dy are equal to multiples of the width w of the marks 225 of the reference index structure 220a, the dots 235-238 can be located in correspondence of the intersections of selected row-column pairs in the reference index structure 220a. As a consequence, the offsets dx and dy are indicative of the position of the images 210b with respect to the wafer.

For example, the horizontal offset dx and the vertical offset dy may be equal to twice the width w of the marks 225. In this case, the dots 235 and 236 of the two adjacent images 210b are located in the third row, third and fourth columns of the reference index structure 220a, respectively; the dots 237 and 238 of the other two adjacent images 210b are instead located in the fourth row, third and fourth columns of the reference index structure 220a, respectively.

In this way, during the fabrication process it is possible to sign each die in a distinctive manner, by simply shifting the wafer under the service reticle 205b by the prescribed distance D (as with any reticle), plus the small horizontal and/or vertical offsets dx and dy. The horizontal and vertical offsets dx and dy corresponds to the positions in the wafer of the four respective dice coated with the portion of the photoresist layer exposed at that step. In the considered example, the maximum size of the offsets dx and dy is equal to twice the width w of the marks 225 (2w) of the reference index structure 220a.

It is observed that, when the service reticle 205b is used, the shift of the wafer in the wafer stepper can be controlled by means of an offset job control file, constituting for example a patch of the normal job control files of the control software of the wafer stepper for the proper positioning of the wafer under an optical system.

At the stage of the fabrication process in which the reticle 205a is used for defining a pattern in a material layer, preferably, sufficiently up in the stack of material layers forming the ICs so as to result visible either directly or indirectly to the human eye or to a suitable image recognition equipment, such as a metal layer, the wafer is coated with a photoresist and accommodated in the wafer stepper together with the reticle 205a. Then, portions of the photoresist corresponding to four chips are exposed "step by step". In this way, for example, a pattern for electrical connections of the ICs and a reference pattern for the index of the dice are simultaneously defined over a metal layer through the reticle 205a (the pattern is represented by exposed/non-exposed areas of the photoresist). At each step the reference pattern is obtained through the reference index structure 220a, which permits to expose photoresist areas in correspondence of the four sets of transparent marks 225.

Successively, the service reticle 205b is accommodated in the wafer stepper in place of the reticle 205a and the exposition of the photoresist is performed again "step by step", but, instead of aligning the wafer as in the former case, the suitable offsets dx and dy are additionally applied to the shift of the wafer under the optical system. Accordingly, areas of the photoresist layer not previously exposed are exposed through the dots 235-238 for indexing each die in a distinctive way.

In detail, at the step 1, the offsets dx and dy are both equal to zero. At the step 2 the offset dy is maintained equal to zero, while the offset dx is increased by w. At the step 3 the offset dx is further increased by w, and becomes equal to 2w. In the step 4 the offset dx is maintained equal to 2w, while the offset dy is increased to w. At the steps 5 and 6 the offset dy is maintained equal to w, while the offset dx is progressively decreased to zero. The fabrication process proceeds similarly for the steps 7-9, in which the offset dy is maintained equal to 2w.

As a consequence, an area corresponding to the dot 235-238 is exposed in each reference index pattern over the metal layer of all the dice in correspondence of a respective position with respect to the reference pattern.

Finally, the photoresist is developed and the metal layer is selectively etched in the area overlapped with the exposed photoresist, leaving on the wafer, for example, the electrical interconnections of the ICs and the visible index identifying the position of the die.

Figure 4:
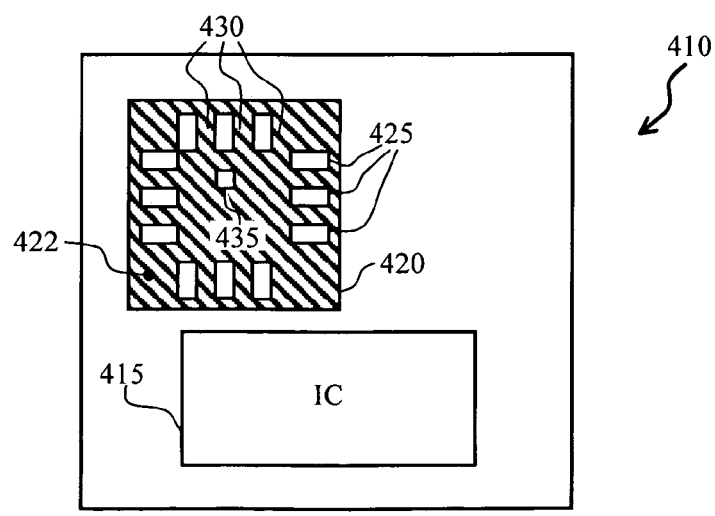
FIG. 4 shows a chip provided with a respective chip index according to the first embodiment of the present invention.

Referring now to FIG. 4, a generic die 410, including ICs 415, carrying an index according to the first embodiment of the present invention, is illustrated (and the dimensions of the index greatly exaggerated).

On the die 410 an index 420 is visible and includes a square, e.g. metal, area 422 and an index dot 435 associated with the metal area 422, i.e., a small area not covered by metal, located somewhere within the metal area 422. In the metal area 422 reference marks 425 are represented by further narrow areas not covered by metal, used as reference for correctly reading the respective position of the index dot 435 in the metal area 422. Accordingly, the index 420 indicates the position of the die 410 in the wafer, as described with reference to FIG. 1B.

It is observed that the visible index 420 is advantageously located in a peripheral region of the die 410, away from active areas of the die used for implementing the ICs 415. Thus, no semiconductor area is wasted for integrating the index structure.

Alternatives to the first embodiment are contemplated. For example, the reference index structure of the images of the reticle exploited for the die indexing may define a different number of rows and columns. Furthermore, the rows and the columns can be identified exploiting marks having a different shape and also the opaque areas can have a different geometry. Alternatively, only two sets of marks can be used, one set for referring the rows and the other set for referring the columns. However, the reference index structure can correspond to an alternative arrangement rather than a matrix.

The service reticle may include structures different than four transparent dots. For example, the service reticle can include cross-shaped or L-shaped windows for leaving a sign in the row and column corresponding to the position of the chips on the wafer. Furthermore, the dots of the images of the additional service reticle can have different positions.

The reticles for indexing the dice may be used at a different stage of the fabrication process, for example, when a polysilicon layer has to be patterned and etched or when a passivation is performed (i.e., the index may be formed in a passivation layer). The offsets can have a different size and can be applied in a different direction with respect to the shift of the wafer in the wafer stepper.

Figure 5A:
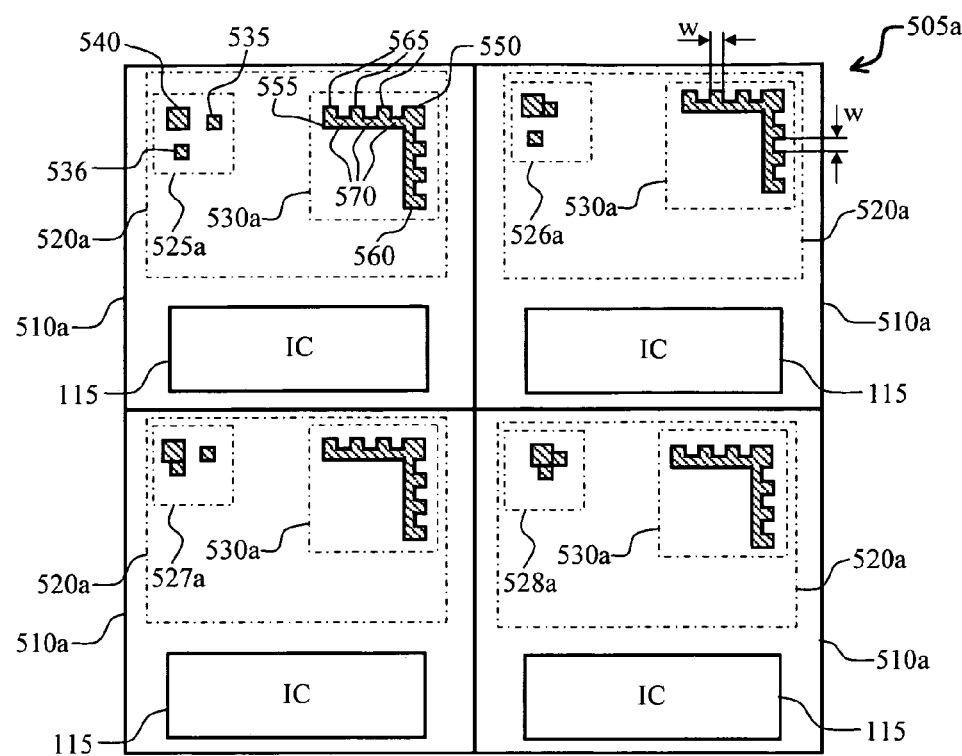
FIG. 5A shows an alternative first mask exploited for implementing a chip indexing method according to a second embodiment of the present invention.

Considering now FIG. 5A, an alternative reticle 505a, exploited for indexing the dice, according to a second embodiment of the present invention is illustrated. The reticle 505a includes four images 510a, each one including the respective IC structure 115, useful for fabricating four dice, and respective index structures 520a for leaving a visible index on each die.

Each index structure 520a includes a respective first reference structure 525a-528a and a respective second reference structure 530a. The four first reference structures 525a-528a are different from each other and are placed in respective boundary areas, particularly in correspondence to a vertex of the images 510a. In the reticle 505a, the image 510a comprising the first reference structure 525a is adjacent to the images 510a comprising the first reference structures 526a and 527a.

The four second reference structures 530a are identical to each other, and each one is placed in a further boundary area, particularly in correspondence of a vertex of the respective image 510a consecutive to the vertex of the respective first reference structures 525a-528a.

In detail, the first reference structures 525a-528a are indicative of the position of the respective image 510a inside the reticle 505a. Particularly, the first reference structures 525a-528a include each one two index dots 535 and 536 and a reference dot 540 opaque to light; the index dot 535 faces a first side of the reference dot 540, the index dot 536 faces a second side of the reference dot 540 consecutive to the first side. The two index dots 535 and 536 can each have a first and second positions with respect to the reference dot 540, i.e., they can have a first distance or a second distance from the reference dot 540, the first distance being greater than the second distance, which is roughly equal to zero.

In the image 510a including the first reference structure 525a, both of the two index dots 535 and 536 are spaced apart from the reference dot 540, i.e. they are both in the second position. In the image 510a including the first reference structure 526a the index dot 536 is in the first position, while the other index dot 535 is in the second position with respect to the reference dot 540. On the contrary, in the image 510a including the first reference structure 527a the index dot 535 is in the first position, while the other index dot 536 is in the second position. In the image 510a including the first reference structure 528a both the two index dots 535 and 536 are in the second position. In this way, the different combinations of the positions of the two index dots 535 and 536 with respect to the reference dot 540 define four respective positions of the images 510a inside the reticle 505a (reticle coordinates).

The second reference structure 530a includes a further opaque reference dot 550 and two comb-shaped opaque areas 555 and 560 orthogonal to each other with respect to axes thereof extending through their length; the reference dot 550 is placed at a vertex of a right angle formed by the two comb-shaped areas 555 and 560.

Each comb-shaped opaque area 555, 560 includes a plurality of longer portions (dents) 565 spaced apart from each other by a plurality of shorter portions (inter-dents); the longer and shorter portions have a same width w, taken along the axis of the comb-shaped opaque area 555, 560. In particular, each comb-shaped area 555, 560 includes, for example, three dents 565 and three inter-dents portions 570.

The dents 565 in a comb-shaped area 555, 560 are distinguished from each other because of their positions with respect to the further reference dot 550. A first dent 565 has the greatest distance from the reference dot 550, a second dent 565 and a third dent 565 have progressively smaller distances from the reference dot 550. By associating the dents 565 of one of the comb-shaped areas 555 and 560 with the dents 565 of the other of the comb-shaped areas 560 and 555 it is possible to realize a number of different combinations. Particularly, in the considered example, being three the dents 565 for each comb-shaped area 555, 560, nine different combinations of pair of dents 565 can be realized so that each combination can be associated to one step of the wafer in the wafer stepper (stepping coordinates).

At a stage of the fabrication process, the wafer, coated with a photoresist layer, is exposed "step by step" through the reticle 505a. At each step, corresponding areas of the photoresist layer are protected by the opaque reference dots 540, the opaque index dots 535 and 536 and the two comp-shaped opaque areas 555 and 560.

Figure 5B:
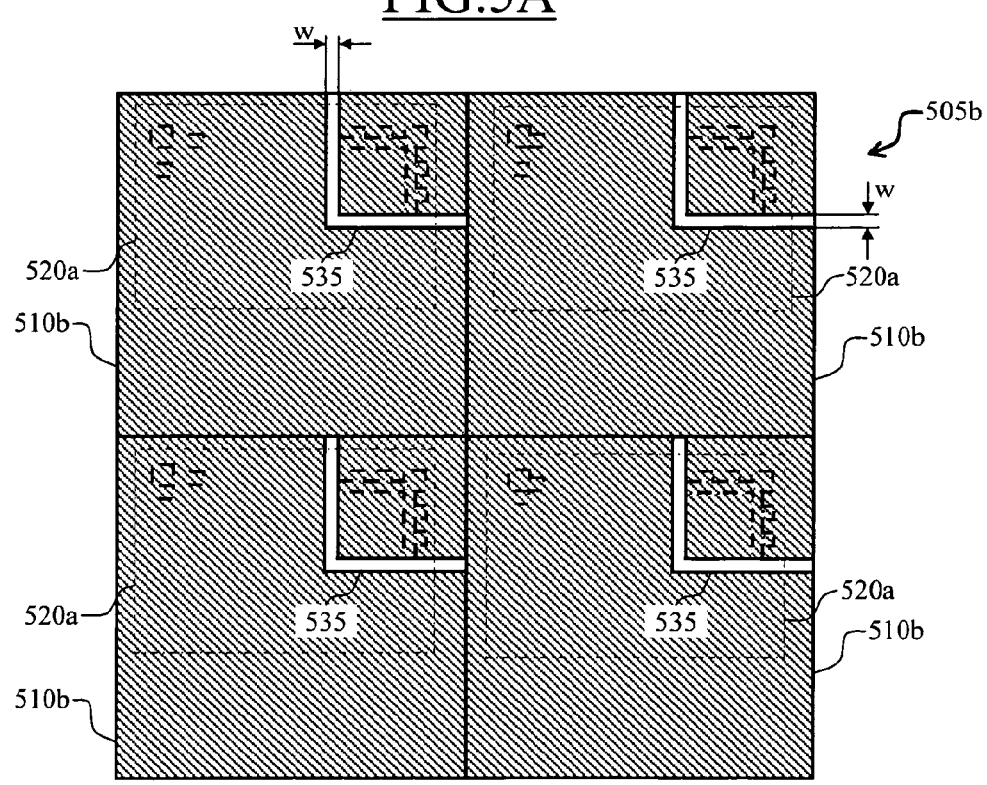
FIG. 5B shows an alternative second, service mask exploited in combination with the first mask of FIG. 5A.

With reference to FIG. 5B, a service reticle 505b according to the second embodiment of the present invention is illustrated. The service reticle 505b includes four identical images 510b, completely opaque to the light except for respective transparent L-shaped windows 535, having a width roughly equal to the width w of the dents of the second reference structure 530a of the reticle 505a.

Assuming that the service reticle 505b is ideally superimposed on the reticle 505a, the position of each window 535 in the service reticle 505b corresponds to the position of the two first dents 565 of the second reference structure 530a (represented by dash-and-dot lines), located at the greater distance from the reference dot 550.

Figure 6:
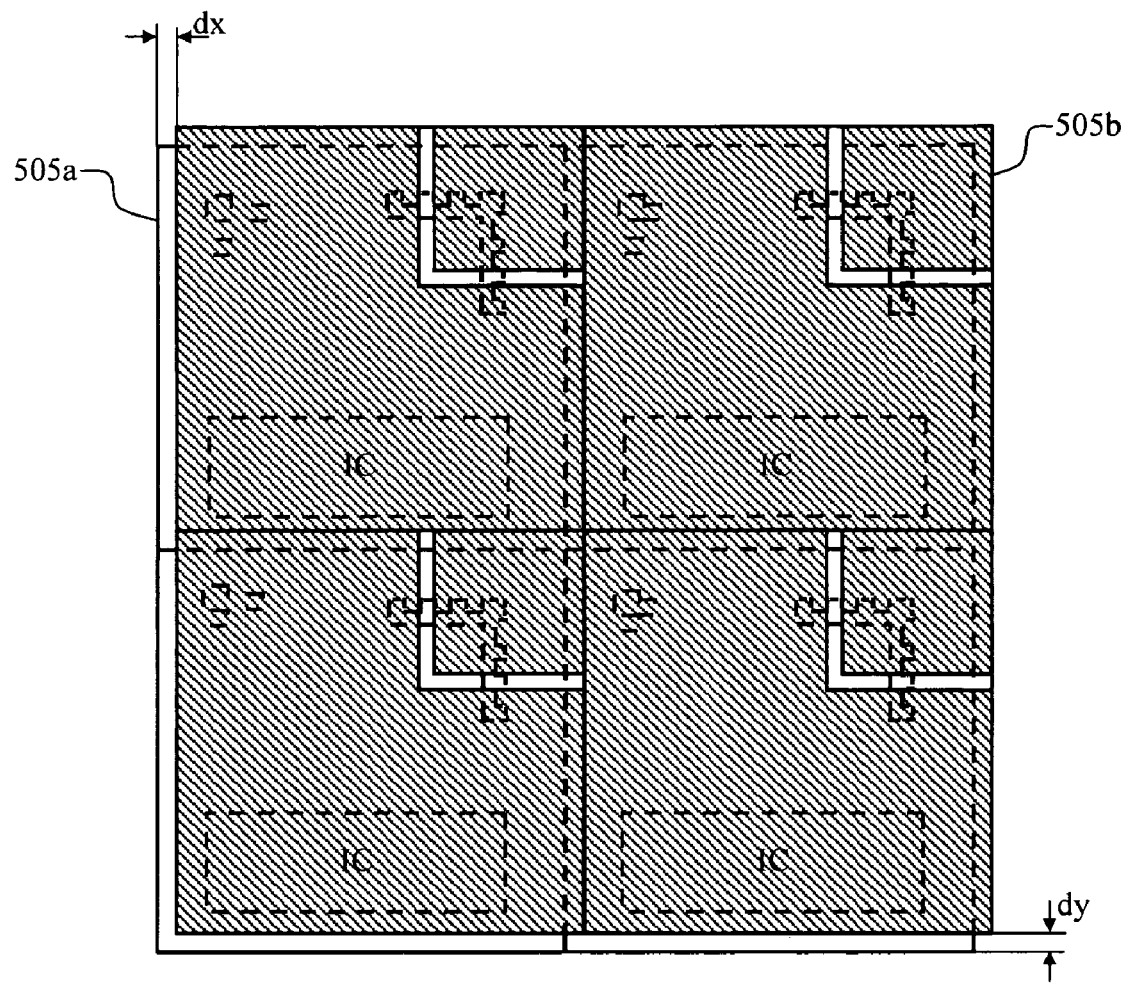
FIG. 6 ideally represents the service mask superimposed on the first mask at a step of the step sequence of the fabrication process.

Referring now to FIG. 6, the service reticle 505b is shown ideally superimposed over the reticle 505a and shifted with respect to the reticle 505a horizontally (i.e., parallelly to the axis of a first comb-shaped area 555) by the horizontal offset dx and vertically (i.e., parallelly to the axis of a second comb-shaped area 560) by the vertical offset dy.

If the sizes of the horizontal and vertical offsets dx and dy are equal to multiples of the width w of the dents 565 of the comb-shaped areas 555 and 560, the windows 535 of the service reticle 505b can be located over desired dents of the two comb-shaped areas 555 and 560.

At the stage of the fabrication process chosen for forming a visible index on the dice, the reticle 505a is accommodated in the wafer stepper together with the wafer coated with the photoresist, and the photoresist is exposed "step by step".

Successively, the service reticle 505b is accommodated in the wafer stepper in place of the reticle 505a and the wafer is moved "step by step" under the optical system by the prescribed distance D, plus the suitable offsets dx and dy for properly indexing each die. At the step 1 the offsets dx and dy are both equal to zero; in this way, at the step 1 areas of the photoresist layer corresponding to the first dents 565 of the second reference structure 530a of the four images 510a are exposed. At the step 2 the offset dy is maintained equal to zero, while the offset dx is increased by twice the width w (2w) of the dents of the second reference structure 530a; areas of the photoresist layer corresponding to the first dent 565 of the comb-shaped area 560 and to the second dent 565 of the comb-shaped area 555 of the four second reference structures 530a are exposed. At the step 3 the offset dx is further increased by twice the width w of the dents and now is equal to 4w and, similarly, a further combination of dents 565 is exploited for indexing the dice. In the step 4 the offset dx is maintained equal to 4w, while the offset dy is then increased to 2w. In the steps 5 and 6 the offset dy is maintained equal to 2w, while the offset dx is progressively decreased to zero, and so on.

As a consequence, at each step, two areas of the photoresist layer corresponding to two desired dents 565 of each projected second reference structure 530a are exposed. The photoresist is then developed and the material layer, e.g. a metal layer, of the wafer underlying the photoresist layer is etched for obtaining the desired pattern; in this way, two desired dents of the second reference structure are etched ("erased") for indicating a respective position of four chips in the wafer depending on the step in which the four chips are treated.

Figure 7:
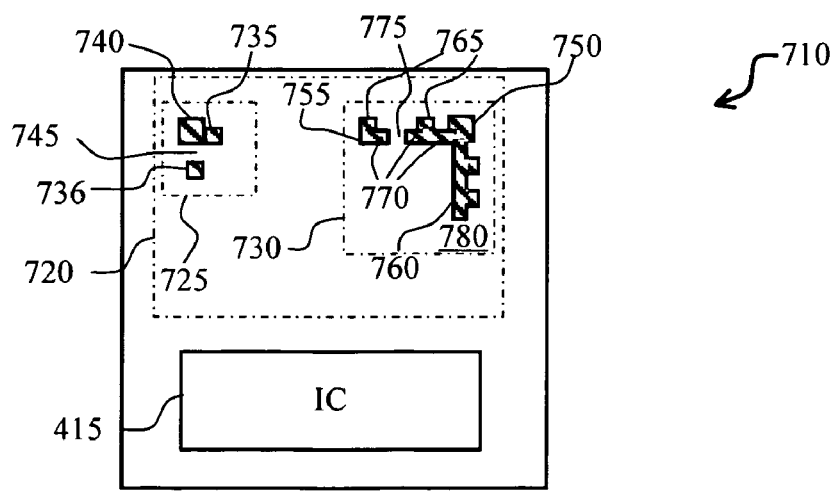
FIG. 7 shows a chip provided with a chip index according to the second embodiment of the present invention.

With reference to FIG. 7, a die 710, including the IC 415, indexed according to the second embodiment of the present invention, is illustrated.

On the die 710, a visible index 720 is provided, for example, in a metal layer of the wafer; the visible index 720 includes a first visible metal sign 725 located in a first corner of the die 710, in which two index metal dots 735 and 736 have respective relative positions with respect to a metal reference dot 740. In particular, a first metal dot 735 is adjacent to the metal reference dot 740 and a second metal dot 736 is spaced apart from the metal reference dot 740 by an inter-dot space 745 having a size equal to the width of the metal dots 735 and 740.

The visible index 720 further includes a second metal sign 730 located in a second corner of the die 710 including a further metal reference dot 750 and two orthogonal comb-shaped metal areas 755 and 760. The further metal reference dot 750 is placed at a vertex of a right angle formed by the two comb-shaped metal areas 755 and 760. Each one of the two metal comb-shaped areas 755 and 760 includes two metal dents 765, one of the three metal dents being "erased" for indexing the die 710. In particular, the first metal dent 765 is spaced apart from the third metal dent 765 by two short metal portions 770 of the comb-shaped area 755 and an area 775 of the die 710 not covered by metal corresponding to the "erased" second dent of the metal comb-shaped area 755. In the metal comb-shaped area 760 the first dent 765 is "erased" and a corresponding area 780 not covered by metal is adjacent to the second metal dent 765.

In the visible index 720, the two signs 725 and 730, taken in association, indicate univocally the position of the die 710 in the wafer before sawing. In this way, two types of coordinates are used in combination for indicating the original position of the dice 710 in the wafer, i.e., the reticle and the stepping coordinates. For example, the above-described visible index 720 is indicative of the position 13, as illustrated in FIG. 1B.

The visible index 720 is located in a peripheral area of the die 710, away from the active area in which the integrated circuits 415 are embedded. Furthermore, the visible index 720 according to the second embodiment of the present invention occupies an area on the die 710 even smaller than the area occupied in the first embodiment and is more easily accommodated in the peripheral region of the die.

Figure 8:
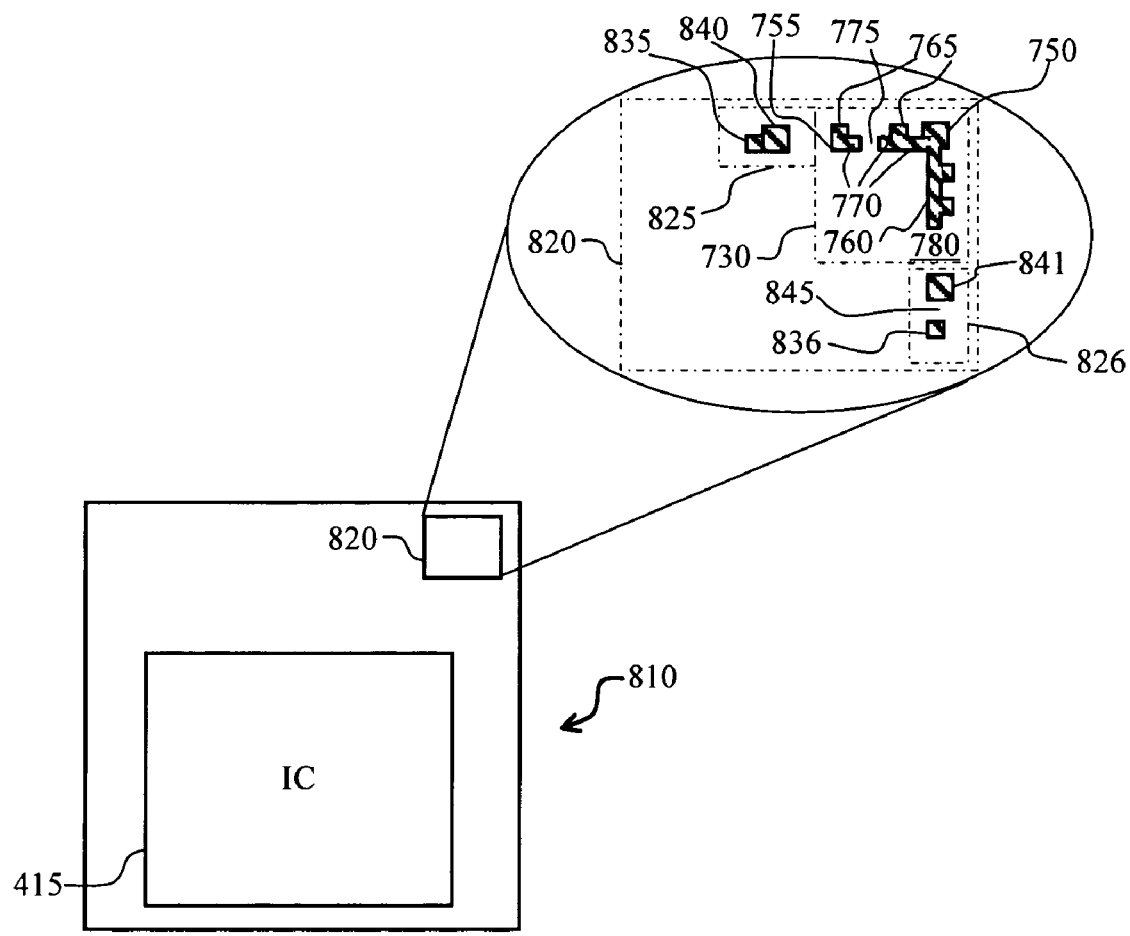
FIG. 8 shows a chip provided with a chip index according to a third embodiment of the present invention.

Considering FIG. 8, a die 810, including the ICs 415, indexed according to a third embodiment of the present invention, is illustrated.

On the die 810, a visible index 820 is provided, for example, in a metal layer of the wafer; as in the second embodiment of the present invention, the visible index 820 includes the metal sign 730 comprising the two orthogonal comb-shaped metal areas 755 and 760 (the elements corresponding to those depicted in FIG. 7 are denoted with the same reference numerals and their description is omitted for the sake of simplicity).

Compared to the second embodiment, the visible index 820 includes two visible metal signs 825 and 826 in place of the sign 725. The metal sign 825 is located in an area of the die 810 adjacent to the comb-shaped metal area 755 and includes an index metal dot 835 adjacent to a metal reference dot 840; the index metal dot 835 has a first relative position with respect to the metal reference dot 840. The metal sign 826 is located in an area of the die 810 adjacent to the comb-shaped metal area 760 and includes an index metal dot 836 spaced apart from a metal reference dot 841 by an inter-dot space 845 having a size equal to the width of the metal dots 836; the index metal dot 836 has a second relative position with respect to the metal reference dot 841. Similarly to the first metal sign 725 of the second embodiment, the whole of the signs 825 and 826 identifies a position of the die in a respective area of the wafer treated by a reticle. Further combinations of the relative positions of the index metal dots 835 and 836 with respect to the metal reference dots 840 and 841 are exploited for identifying other corresponding positions of the die 810 in the respective area of the wafer.

At the stage of the fabrication process chosen for forming the visible index 820, a first reticle is exploited for forming the signs 825 and 826 and the two comb-shaped metal area 755 and 760, and a second reticle, e.g. identical to the reticle 505b of FIG. 5B, is exploited for "erasing" two dents of the comb-shaped metal area 755 and 760.

As in the second embodiment of the present invention, in the visible index 820, the signs 825, 826 and 730, taken in association, indicate univocally the position of the die 810 in the wafer before sawing. Two types of coordinates are used in combination for indicating the original position of the dice 810 in the wafer, i.e., the reticle and the stepping coordinates.

The visible index 820 is located in a peripheral area of the die 810, away from the active area in which the integrated circuits 415 are embedded. In particular, the visible index 820 is located in a limited area corresponding to one of four corners of the die 810. In this way, by limiting the occupied area of the die 810 the visible index 820 can be easily read, and the die 810 identified, by an optical system for automatic image recognition.

The visible index can be useful also during testing, for example, during an Electrical Wafer Sorting (shortly, EWS), when defective dice have to be identified for being discarded before sawing and packaging. Such an application avoids the need for marking the defective dice with an ink dot, so as to make them recognizable after sawing, since it is possible to read the respective visible indexes and to store them, e.g., in a file successively exploited during packaging.

It is to be pointed out that the first and second reference structures have different geometries; for example, the first reference structure can have the two index dots and the reference dot aligned, the reference dot in the center. Alternatively, the first reference structure can include sequential numbers in place of the dots, since the number of chips treated by one reticle at each step is smaller than the total number of the chips obtained from the wafer and, typically, also than the number of steps. Similarly, the second reference structure can have an alternative shape or an alternative architecture; for example, the second reference structure can correspond to a matrix having a number of elements equal to the number of steps by which the wafer is exposed in one stage of the manufacturing process. Furthermore, the first and second reference structures can include a different number of reference dots and a different number of index dots and dents.

The service reticle may include different structures than four transparent L-shaped windows; for example, the service reticle can include cross-shaped windows.

The vertical and horizontal offsets may be different, depending on the geometry of the second reference structures in the service reticle.

In general, the wafer, the dice and the reticles can have alternative shapes. The wafer can include a different number of dice and the reticles a different number of images; furthermore, a diverse number of steps may be used for exposing the whole wafer. However, the dice can include, in place of the integrated circuits, an opto-electronic device, an integrated optics structure, and the like. In a process for patterning a desired material layer of the wafer, the wafer can be coated with a resist material that has to be exposed, in place of light, to an alternative electromagnetic radiation or to a beam of particles.

The methods of indexing according to the described embodiments of the present invention can be implemented with a single additional service reticle, but without adding any further stage to the normal IC fabrication process. At the stage of the process chosen for forming the visible index on the die, the use of the additional service reticle does not require to coat again the wafer with a further photoresist layer and the photoresist layer is developed once, at the end of the process stage. In addition, the visible index often occupies a peripheral area on the die smaller than an area necessary for a visible sequential number having a number of digits depending on the total number of the chips obtained from the wafer. Such a peculiarity is particularly important when the sizes of the die are reduced.

Furthermore, a visible index avoids the problem of making even more prone to defects the chips, by adding service storage elements, and does not occupy an intended active area of the chips; in the case in which failed chips undergo functional failures, the position of the chips on wafer before sawing may be recoverable. All these improvements compensate the minor costs of the additional service reticle, which can be exploited during a selected stage of the fabrication process without adding dedicated process stages. Furthermore, such a visible index is applicable on wafers of any size and is exportable to any technology.

An electronic system, such as a computer system, can include an integrated circuit having a die with a visible index according to an embodiment of the invention.

Naturally, in order to satisfy specific requirements, a person skilled in the art may apply to the solution described above many modifications and alterations all of which, however, are included within the spirit and scope of protection of the invention. For example, the reference structures, such as 225, 230, 535, 536, 540, 550, 555, and 560 may be laid out in one dimension or three dimensions instead of two dimensions.

What is claimed is:

1. A die obtained from a material wafer comprising a plurality of stacked material layers, the die being provided with a visible index indicative of a respective die position of the die in the wafer, the visible index includes
   a reference structure formed in a first material layer of the die and adapted to defining a mapping of the wafer; and
   a marker formed in a second material layer of the die, associated with the reference structure, and adapted to providing an indication of the respective die position.

2. The die according to claim 1, obtained from a semiconductor material wafer, wherein the die includes integrated circuits formed in the plurality of stacked material layers.

3. The die according to claim 1, wherein the first material layer of the die coincides with the second material layer of the die and particularly includes one among a metal layer, a polysilicon layer, and a passivation layer.

4. A die obtained from a wafer, the die comprising:
   first and second layers;
   a first reference disposed in the first layer and defining first points that each represent a respective region of the wafer; and
   a first marker disposed in the second layer and in alignment with the first point that corresponds to the region of the wafer in which the die was located.

5. The die of claim 4 wherein the first and second layers comprise the same layer.

6. The die of claim 4, further comprising:
   wherein each region of the wafer included multiple dies; third and fourth layers;
   a second reference disposed in the third layer and defining second points that each represent a respective position within each region of the wafer; and
   a second marker disposed in the fourth layer and in alignment with the second point that corresponds to the position of the die within the region of the wafer in which the die was located.

7. The die of claim 6 wherein the first layer, second, third, and fourth layers comprise the same layer.

8. The die of claim 4, further comprising circuitry.

9. The die of claim 4, further comprising:
   wherein each region of the wafer included multiple dies;
   third and fourth layers;
   a second reference disposed in the third layer and defining pairs of second points, each pair of second points representing a respective position within each region of the wafer; and
   second and third markers disposed in the fourth layer and respectively in alignment with the second points of the pair that corresponds to the position of the die within the region of the wafer in which the die was located.

10. The die of claim 4 wherein the first reference defines a two-dimensional array of the first points.

11. A wafer, comprising:
    a plurality of dies each comprising,
       first and second layers,
       a reference disposed in the first layer and defining points that each represent a respective region of the wafer, and
       a marker disposed in the second layer and in alignment with the point that corresponds to the region of the wafer in which the die is located.

12. An integrated circuit, comprising:
    a package; and
    a die obtained from a wafer, disposed within the package, and comprising,
       first and second layers,
       a reference disposed in the first layer and defining points that each represent a respective region of the wafer, and
       a marker disposed in the second layer and in alignment with the point that corresponds to the region of the wafer in which the die was located.

13. An electronic system, comprising:
    integrated circuit, comprising,
       a package; and
       a die obtained from a wafer, disposed within the package, and comprising,
          first and second layers,
          a reference disposed in the first layer and defining points that each represent a respective region of the wafer, and
          a marker disposed in the second layer and in alignment with the point that corresponds to the region of the wafer in which the die was located.

* * * * *